United States Patent
Tada et al.

(10) Patent No.: US 9,548,115 B2
(45) Date of Patent: Jan. 17, 2017

(54) VARIABLE RESISTANCE ELEMENT, SEMICONDUCTOR DEVICE HAVING VARIABLE RESISTANCE ELEMENT, SEMICONDUCTOR DEVICE MANUFACTURING METHOD, AND PROGRAMMING METHOD USING VARIABLE RESISTANCE ELEMENT

(71) Applicants: Munehiro Tada, Tokyo (JP);
Toshitsugu Sakamoto, Tokyo (JP);
Makoto Miyamura, Tokyo (JP)

(72) Inventors: Munehiro Tada, Tokyo (JP);
Toshitsugu Sakamoto, Tokyo (JP);
Makoto Miyamura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/385,623

(22) PCT Filed: Mar. 14, 2013

(86) PCT No.: PCT/JP2013/001698
§ 371 (c)(1),
(2) Date: Sep. 16, 2014

(87) PCT Pub. No.: WO2013/136798
PCT Pub. Date: Sep. 19, 2013

(65) Prior Publication Data
US 2015/0103583 A1 Apr. 16, 2015

(30) Foreign Application Priority Data
Mar. 16, 2012 (JP) .................................. 2012-060864

(51) Int. Cl.
*G11C 13/00* (2006.01)
*H01L 45/00* (2006.01)
*H01L 27/10* (2006.01)

(52) U.S. Cl.
CPC ....... *G11C 13/0069* (2013.01); *G11C 13/0002* (2013.01); *G11C 13/0007* (2013.01);
(Continued)

(58) Field of Classification Search
CPC ...................... G11C 13/0069; H01L 45/1206
(Continued)

(56) References Cited

U.S. PATENT DOCUMENTS 7,425,720 B2 * 9/2008 Kaeriyama ......... G11C 11/5614
257/296
9,246,095 B2 * 1/2016 Cho ...................... H01L 27/249
(Continued)

FOREIGN PATENT DOCUMENTS

JP  2005-101535 A  4/2005
JP  2006-120702 A  5/2006
(Continued)

OTHER PUBLICATIONS

Translation with original for WO 2011158821 A1 and JP 2010199498 A is provided as attachment.*
(Continued)

*Primary Examiner* — Alexander Sofocleous
*Assistant Examiner* — Mushfique Siddique

(57) ABSTRACT

This variable resistance element is provided with a variable resistance film, a first electrode, which is disposed in contact with one surface of the variable resistance film, and a second electrode, which is disposed in contact with the other surface of the variable resistance film. The first and the second electrodes have corner portions, respectively, and the distance between the corner portions of the first and the second electrodes is set equal to the shortest distance between the first and the second electrodes. Furthermore, the variable resistance element has a third electrode, which is disposed on the one surface of the variable resistance film.

9 Claims, 13 Drawing Sheets

(52) U.S. Cl.
CPC .......... *H01L 27/101* (2013.01); *H01L 45/085* (2013.01); *H01L 45/122* (2013.01); *H01L 45/1206* (2013.01); *H01L 45/1226* (2013.01); *H01L 45/1233* (2013.01); *H01L 45/1253* (2013.01); *H01L 45/1266* (2013.01); *H01L 45/1273* (2013.01); *H01L 45/1608* (2013.01); *G11C 2013/009* (2013.01); *G11C 2013/0073* (2013.01); *G11C 2213/15* (2013.01); *G11C 2213/17* (2013.01); *H01L 45/144* (2013.01); *H01L 45/146* (2013.01)

(58) Field of Classification Search
USPC .............................................. 365/148; 257/4
See application file for complete search history.

(56) References Cited

U.S. PATENT DOCUMENTS

| | | | |
|---|---|---|---|
| 2006/0081962 | A1 | 4/2006 | Wei et al. |
| 2008/0212259 | A1* | 9/2008 | Sakamoto .......... G11C 13/0023 361/500 |
| 2009/0309088 | A1* | 12/2009 | Sakamoto ............... H01L 27/24 257/2 |
| 2010/0038619 | A1* | 2/2010 | Tada ....................... H01L 45/04 257/3 |
| 2011/0272664 | A1* | 11/2011 | Tada ..................... H01L 27/228 257/4 |
| 2012/0097916 | A1* | 4/2012 | Tada ..................... H01L 27/101 257/4 |
| 2012/0193597 | A1* | 8/2012 | Shingu ................. H01L 27/101 257/2 |
| 2012/0236626 | A1* | 9/2012 | Gaillardon .......... H01L 27/2445 365/148 |
| 2013/0092895 | A1* | 4/2013 | Tada ..................... H01L 45/085 257/5 |

FOREIGN PATENT DOCUMENTS

| | | |
|---|---|---|
| JP | 2010-062265 A | 3/2010 |
| JP | 2010-199498 A | 9/2010 |
| JP | 2010199498 A * | 9/2010 |
| WO | 2011/013255 A1 | 2/2011 |
| WO | 2011/158821 A1 | 12/2011 |
| WO | WO 2011158821 A1 * | 12/2011 |

OTHER PUBLICATIONS

Shunichi Kaeriyama et al., "A Novolatile Programmable Solid-Electrolyte Nanometer Switch", IEEE Journal of Solid-State Circuits, Jan. 2005, vol. 40, No. 1, pp. 168-176.
International Search Report for PCT Application No. PCT/JP2013/001698, mailed on Apr. 16, 2013.
Japanese Office Action for JP Application No. 2014-504708 mailed on Sep. 6, 2016 with English Translation.

* cited by examiner

VARIABLE RESISTANCE ELEMENT, SEMICONDUCTOR DEVICE HAVING VARIABLE RESISTANCE ELEMENT, SEMICONDUCTOR DEVICE MANUFACTURING METHOD, AND PROGRAMMING METHOD USING VARIABLE RESISTANCE ELEMENT

This application is a National Stage Entry of PCT/JP2013/001698 filed on Mar. 14, 2013, which claims priority from Japanese Patent Application 2012-060864 filed on Mar. 16, 2012, the contents of all of which are incorporated herein by reference, in their entirety.

TECHNICAL FIELD

The present invention relates to a semiconductor device and a production process therefor, and especially to a semiconductor device having a variable resistance nonvolatile element (hereinafter referred to as "variable resistance element") and a production process therefor. Further, it relates to a programming method using the variable resistance element.

BACKGROUND ART

With respect to a semiconductor device (especially, a silicon device), integration and power reduction of a device have been advanced owing to miniaturization (scaling law; Moore's law), and progress in integration and power reduction at a pace of 4-fold per 3 years has been made. However, the gate length of a MOSFET (Metal Oxide Semiconductor Field Effect Transistor) has recently reached 20 nm or less bringing substantial cost increase of a lithography process (device price, and mask set price), and a physical limit of a device dimension (operating limit, or variation limit), and improvement of the device performance by an approach different from the past one depending on the scaling law has come to be sought-after.

A programmable logic device which is reprogrammable called as FPGA (Field Programmable Gate Array), which may be positioned in an intermediate category between a gate array and a standard cell, has been recently developed. With a FPGA, customers themselves can conduct an arbitrary circuit configuration after production of a chip. A FPGA has variable resistance elements, so that customers themselves can establish at their arbitrary electrical connections of wiring. By use of a semiconductor device mounting such a FPGA, the degree of freedom of a circuit can be improved. Examples of a variable resistance element include a ReRAM (Resistance Random Access Memory) using a transition metal oxide, and a solid electrolyte switch or an atomic switch using an ion conductor.

Patent Literature 1 and Non Patent Literature 1 disclose a constitution, an operation, and a crossbar switch in the case of a 2-terminal type switching element (variable resistance element), which regulates the conduction state between two electrodes placed sandwiching an ion conductor (a solid in which an ion can move freely by application of an electric field, or otherwise).

Non Patent Literature 1 discloses a switching element utilizing metal ion movement in an ion conductor and an electrochemical reaction. A switching element disclosed in Non Patent Literature 1 is configured with an ion conductive layer, and a first electrode and a second electrode placed such that the two face each other sandwiching the ion conductive layer. Among these, the first electrode functions as a supplier of a metal ion to the ion conductive layer. The second electrode does not supply a metal ion to the ion conductive layer.

The operation of the switching element will be described briefly. When the second electrode is grounded and a positive voltage is applied to the first electrode, a metal of the first electrode dissolves as a metal ion into the ion conductive layer. Then, the metal ion in the ion conductive layer deposits as a metal in the ion conductive layer and the deposited metal forms a metal-bridge (also called as filament, or conductive path), which connects the first electrode with the second electrode. Due to the electrical connection of the first electrode and the second electrode with the metal-bridge, the switch is put into an ON-state. Meanwhile, in the ON-state, if the first electrode is grounded and a positive voltage is applied to the second electrode, a part of the metal-bridge breaks. As the result, the electrical connection between the first electrode and the second electrode is broken, and the switch is put into an OFF-state. In this regard, at a stage prior to complete breakage of an electrical connection, electrical properties start changing such that the resistance between the first electrode and the second electrode increases, the interelectrode capacitance changes, or the like, and finally the electrical connection breaks. Further, in order to change the OFF-state to an ON-state, the second electrode is grounded again, and a positive voltage is applied to the first electrode.

The switching element is characterized in that the size is smaller than a semiconductor switch (MOSFET, etc.), and the ON-resistance (resistance in an ON-state) is low. Therefore, the switching element is considered to have promise for application to a programmable logic device. Since the conduction state (ON or OFF) of the switching element can be maintained as original without applying a voltage, an application as a nonvolatile memory element is also conceivable. For example, a memory cell containing a selective element such as a transistor and a switching element is used as a basic unit, and a plurality of the memory cells are aligned in each of a longitudinal direction and a cross direction. By the alignment, an optional memory cell can be selected among a plurality of the memory cells by means of a word line and a bit line. Thus, a nonvolatile memory can be realized, in which the stored information of either of "1" or "0" can be read from the state of ON or OFF of the switching element by sensing the conduction state of the switching element of the selected memory cell.

CITATION LIST

Patent Literature

[PTL 1] Japanese Patent Application Laid-Open No. 2005-101535

Non Patent Literature

[NPL 1] S. Kaeriyama, et al., "A Nonvolatile Programmable Solid-Electrolyte Nanometer Switch", IEEE Journal of Solid-State Circuits, Vol. 40 (1), pp. 168-176 (2005)

SUMMARY OF INVENTION

Technical Problem

With respect to a variable resistance element according to Patent Literature 1 and Non Patent Literature 1, there has been a drawback that the variation of (programming) threshold voltage is large, because a current path (called also as filament or bridge) in a low resistance state appears randomly inside a variable resistance film.

Further, it is necessary to keep high programming voltage in order to prevent miswriting or malfunction, and as the result there is a drawback that reduction of voltage is hardly attainable.

The present invention has been made in view of such drawbacks of the technology, and has an object to provide a variable resistance element mounting a variable resistance element, which can enjoy high reliability and high density even at a low voltage, and a production process therefor.

Solution to Problem

A variable resistance element according to the present invention is provided with a variable resistance film, a first electrode placed abutting on one of surfaces of the variable resistance film, and a second electrode placed abutting on the other surface of the variable resistance film, wherein each of the first and the second electrodes has a corner, and the distance between the corners of the first and the second electrodes is the shortest distance between the first and the second electrodes.

Further, a production process for a semiconductor device according to the present invention comprises an insulation barrier film forming step for forming an insulation barrier film on two first wires provided in one of wiring layers included in the multi-layer wiring, an opening forming step for forming in the insulation barrier film an opening having a tapered surface on a wall surface, which diameter expands with the distance in a vertical direction from the two first wires, and exposing at least a part of an upper surface of the two first wires, a variable resistance film forming step for forming a variable resistance element film at least at the opening including the wall surface, an electrode forming step for forming an electrode on the variable resistance film, and a step for forming a second wire connected with the electrode in a wiring layer of the multi-layer wiring different from the wiring layer, in which the two first wires are formed.

A programming method of a variable resistance element according to the present invention is a programming method of a variable resistance element, in which a variable resistance film is sandwiched such that a distance between corners of first and second electrodes is the shortest distance between the first and second electrodes, and which includes a third electrode placed on the same surface where the first electrode is placed, wherein an initial state is a state in which a voltage is applied between the first and second electrodes, a voltage pulse is applied to the third electrode for changing the electrical resistance of the variable resistance film.

Advantageous Effects of Invention

According to the present invention, the shortest distance between both the corners of the first electrode and the second electrode is defined, and therefore a location where a filament (conductive path) is formed is defined. From this, a programming operation can be stabilized, and the variation of a programming voltage can be suppressed to a low level enabling the programming voltage to be lowered.

Further, since each electrode is a corner, the effective electric field during programming can be intensified due to an effect of electric field concentration, and therefore a programming voltage can be lowered.

DESCRIPTION OF EMBODIMENTS

Preferable Embodiments for implementing the present invention will be described below using drawings, provided that the following Embodiments in no way limit the scope of the invention, although there are certain preferable technical restrictions described therein for implementing the present invention.

Prior to detailed description of Embodiments of the present invention, the meanings of terms used herein will be described.

In terms of operating characteristics of a variable resistance element, there are 2 types, namely a unipolar type and a bipolar type. A unipolar variable resistance element is a switching element, which can be switched over between a high resistance state (OFF state) and a low resistance state (ON state) by application of a voltage. A bipolar variable resistance element is a switching element, which can be switched over between a high resistance state and a low resistance state by the polarity of an applied voltage. A bipolar variable resistance element can be used in ReRAM and NanoBridge (registered trademark), and a unipolar variable resistance element can be used in ReRAM.

The operation of a unipolar variable resistance element will be described. FIG. 1A to FIG. 1D are diagrams depicting operating characteristics of a unipolar variable resistance element. In the present case, a unipolar variable resistance element is configured including a first electrode and a second electrode, as well as a variable resistance element sandwiched by the two electrodes.

Figure 1A:
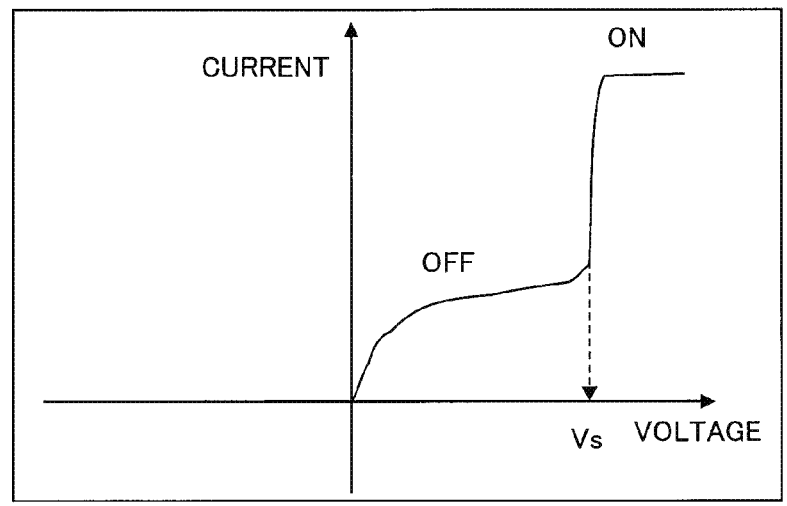
FIG. 1A is a diagram depicting operating characteristics of a unipolar variable resistance element according to an Embodiment of the present invention.

When a positive voltage is applied to the first electrode, as depicted in FIG. 1A, a variable resistance element transits an intended set voltage Vs as a threshold voltage from an OFF state to an ON state. An OFF state means a state, in which the resistance between the 2 electrodes is high (high resistance state), and an ON state means a state, in which the resistance between the 2 electrodes is low (low resistance state). The threshold voltage depends on the film thickness, composition, density, etc. of a variable resistance layer.

Figure 1B:
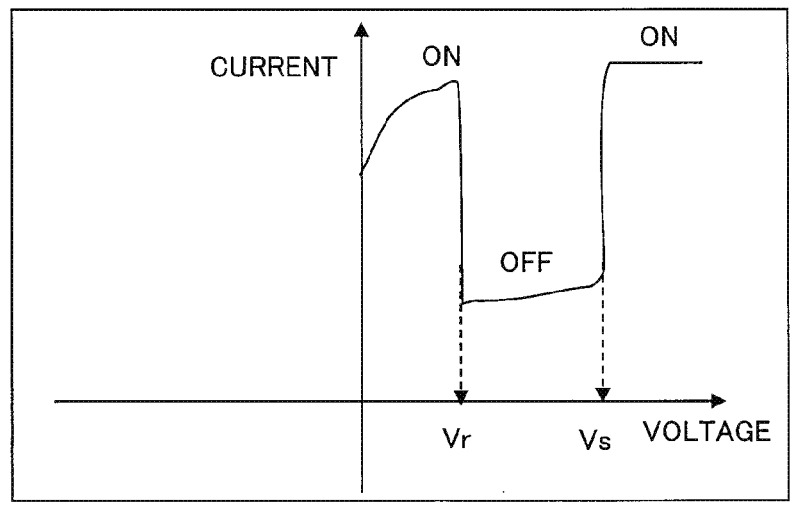
FIG. 1B is a diagram depicting operating characteristics of a unipolar variable resistance element according to an Embodiment of the present invention.

Next, when a positive voltage is applied again to the first electrode of a variable resistance element in an ON state, as depicted in FIG. 1B, the element transits from an ON state to an OFF state at an intended threshold voltage (reset voltage Vr). Further, when application of a positive voltage to the first electrode is continued, the set voltage Vs is reached and the variable resistance element transits again from the OFF state to an ON state.

Figure 1C:
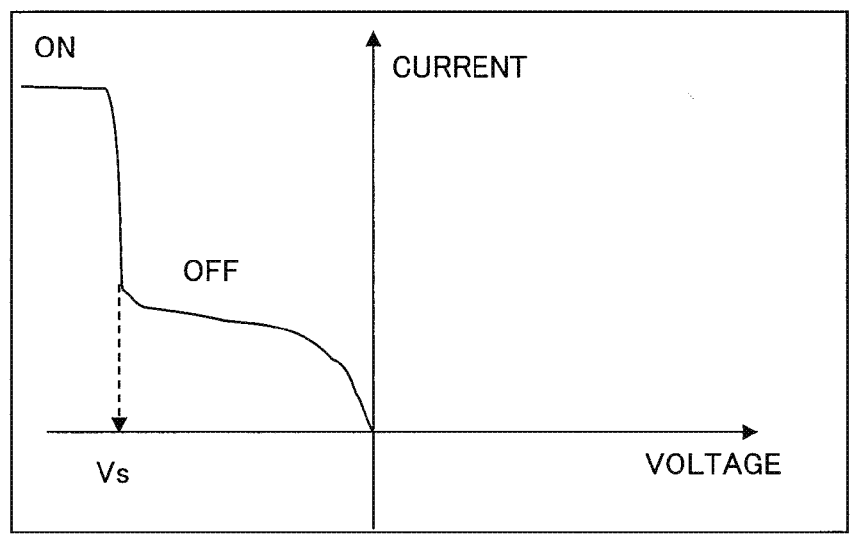
FIG. 1C is a diagram depicting operating characteristics of a unipolar variable resistance element according to an Embodiment of the present invention.
Figure 1D:
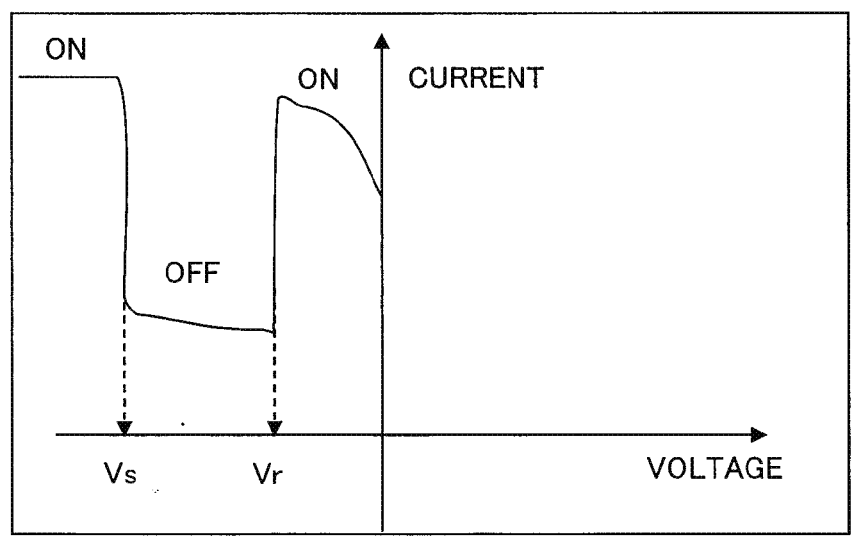
FIG. 1D is a diagram depicting operating characteristics of a unipolar variable resistance element according to an Embodiment of the present invention.

Meanwhile, when a negative voltage is applied to the first electrode, as depicted in FIG. 1C, the element transits an intended set voltage Vs as a threshold voltage from an OFF state (high resistance state) to an ON state (low resistance state). Next, when a negative voltage is applied again to the first electrode of a variable resistance element in an ON state, as depicted in FIG. 1D, the element transits from an ON state to an OFF state at an intended threshold voltage (reset voltage Vr). Further, when application of a negative voltage to the first electrode is continued, the set voltage Vs is reached and the variable resistance element transits again from the OFF state to an ON state.

As described above, with respect to the variable resistance element, the operation of FIG. 1A and FIG. 1B, and the operation of FIG. 1C and FIG. 1D are symmetrical, and the resistance change characteristics are not dependent on the application direction (polarity) of a voltage, but dependent only on the level of a voltage. Such an element is defined as a unipolar variable resistance element.

Next, the operation of a bipolar variable resistance element will be described. FIG. 2A to FIG. 2D are diagrams depicting operating characteristics of a bipolar variable resistance element. For the sake of comparison, the voltage-current characteristics of a bipolar variable resistance element having a similar constitution as the above unipolar variable resistance element are depicted here.

Figure 2A:
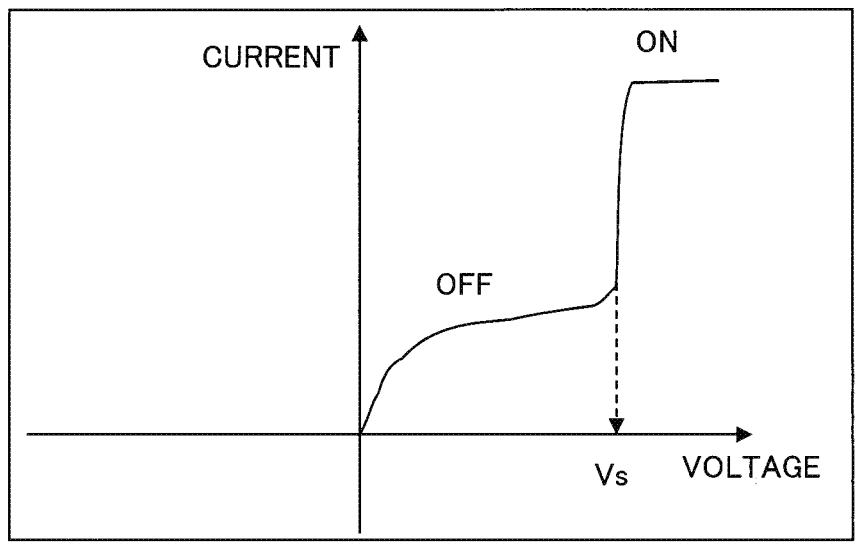
FIG. 2A is a diagram depicting operating characteristics of a bipolar variable resistance element according to an Embodiment of the present invention.
Figure 2B:
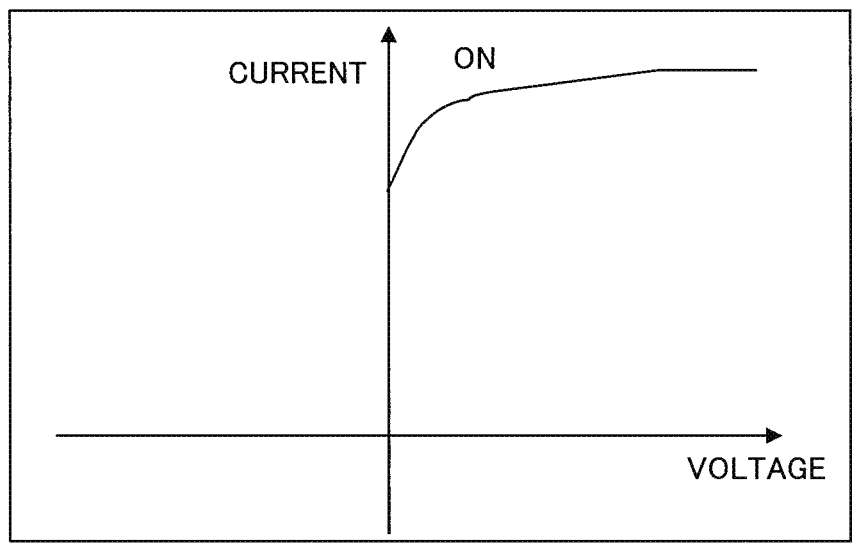
FIG. 2B is a diagram depicting operating characteristics of a bipolar variable resistance element according to an Embodiment of the present invention.
Figure 2C:
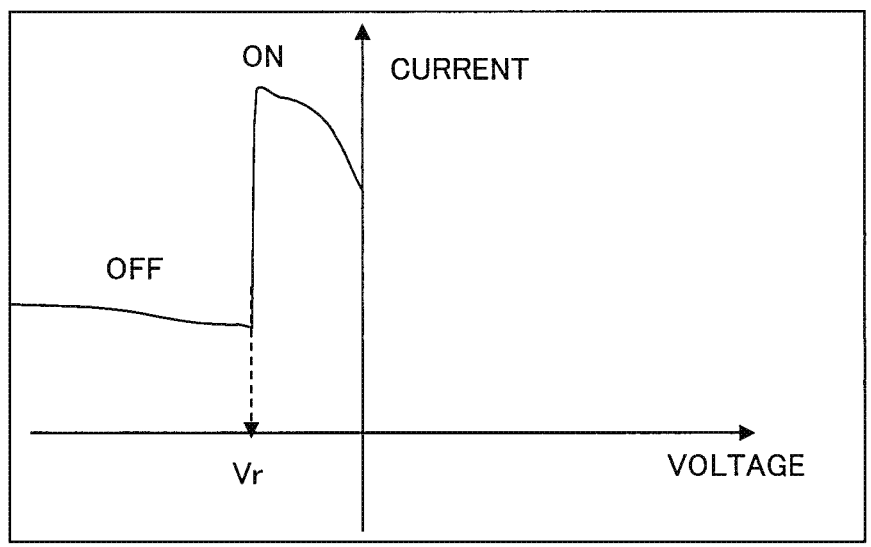
FIG. 2C is a diagram depicting operating characteristics of a bipolar variable resistance element according to an Embodiment of the present invention.

When a positive voltage is applied to the first electrode, as depicted in FIG. 2A, a variable resistance element transits an intended set voltage Vs as a threshold voltage from an OFF state (high resistance state) to an ON state (low resistance state). Next, when a positive voltage is applied again to the first electrode of a variable resistance element in the ON state, a resistance change as seen in the case of a unipolar variable resistance element does not occur and an ohmic current-voltage characteristic appears as depicted in FIG. 2B, while the variable resistance element maintains the ON state.

Figure 2D:
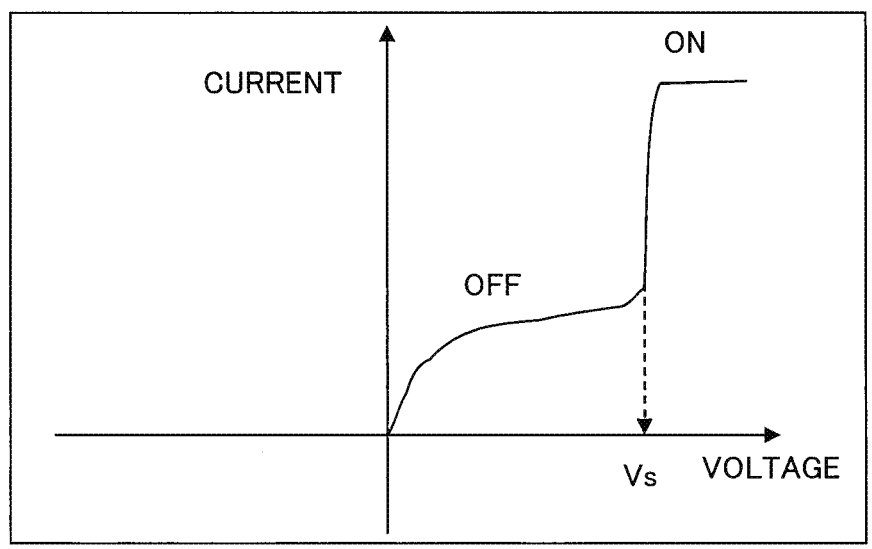
FIG. 2D is a diagram depicting operating characteristics of a bipolar variable resistance element according to an Embodiment of the present invention.

Meanwhile, when a negative voltage is applied to the first electrode of a variable resistance element in the ON state (FIG. 2C), the element transits an intended set voltage Vs as a threshold voltage from the ON state (low resistance state) to an OFF state (high resistance state). Next, when a positive voltage is applied again to the first electrode of a variable resistance element in the OFF state, as depicted in FIG. 2D, the element transits from the OFF state to an ON state at a reset voltage Vr.

As described above, only when a positive voltage is applied to the first electrode, a bipolar variable resistance element transits from an OFF state to an ON state, and only when a negative voltage is applied to the first electrode, the same transits from an ON state to an OFF state. Such an element is defined as a bipolar variable resistance element.

Now, with respect to an electrode to be used in a bipolar variable resistance element, the following definitions are supplied. An electrode, which transits from an OFF state to an ON state when a positive voltage is applied as described referring to FIG. 2A to FIG. 2D, is defined as "first electrode" or "active electrode". Reversely, an electrode, which transits from an ON state to an OFF state when a positive voltage is applied, is defined as "second electrode" or "inactive electrode".

Figure 3:
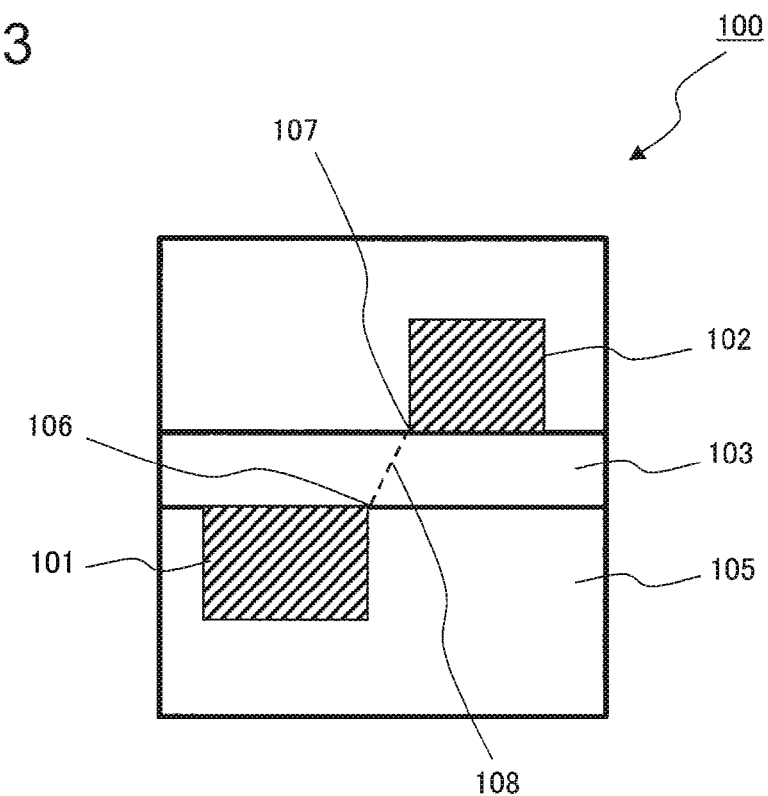
FIG. 3 is a cross-sectional view of a variable resistance element according to the first Embodiment of the present invention.

[First Embodiment] The constitution of a variable resistance element 100 used in a semiconductor device according to the first Embodiment of the present invention will be described. FIG. 3 is a diagram depicting an exemplar constitution of a variable resistance element to be used in the semiconductor device according to the Embodiment.

[Description of Structure] The variable resistance element 100 depicted in FIG. 3 is for example a solid electrolyte switch (atomic switch) presenting bipolar type resistance change operation. It is configured including a first electrode 101 (active electrode), a second electrode 102 (inactive electrode), and a variable resistance film 103 sandwiched by the electrodes. They are formed inside an insulation film 105 on a semiconductor substrate (not illustrated). The variable resistance film 103 is for example an ion conductor disclosed in Non Patent Literature 1.

The first electrode 101 has a corner of first electrode 106, and the second electrode 102 has a corner of second electrode 107. In this regard, a corner of electrode according to Embodiment of the present invention means a corner that is located in an electrode at a position closest to the other electrode among many corners owned by the two electrodes.

The distance between the corner of first electrode 106 and the corner of second electrode 107 is represented by a corner-to-corner distance 108. In this case the corner-to-corner distance 108 coincides with the shortest path of an inter-electrode distance between the first electrode 101 and the second electrode 102.

For example, in a case in which the first electrode 101 is Cu, the second electrode 102 is Ru, and the variable resistance film 103 is a polymer solid electrolyte, a transition from a high resistance state (OFF state) to a low resistance state (ON state) will be described (set operation). In this regard, it is enough if the first electrode 101 contains Cu as a main component, and it may be an alloy containing Cu.

[Description of Operation] The second electrode 102 is grounded to 0 V, and a positive voltage is applied to the first electrode 101. An electric field (the number of electrical lines of force per unit area) induced by the applied voltage between the first electrode and the second electrode is maximum on the corner-to-corner distance 108. As the result a path of deposition of a Cu ion in the variable resistance film 103 sandwiched by the first electrode and the second electrode is defined along the corner-to-corner distance 108 forming a Cu bridge to cause transition to a low resistance state (ON state).

Next, a transition from a low resistance state (ON state) to a high resistance state (OFF state) will be described (reset operation). The first electrode 101 is grounded to 0 V, and a positive voltage is applied to the second electrode 102. The current flown by the voltage applied between the first electrode and the second electrode is maximum along the corner-to-corner distance 108. This coincides with a formation location of a Cu bridge formed in the variable resistance film 103 sandwiched by the first electrode and the second electrode. As the result, a current path is defined along the corner-to-corner distance 108, and when it reaches a threshold current (or voltage), transition to a high resistance state (OFF state) occurs.

[Description of Action and Advantage] By defining a corner of first electrode and a corner of second electrode as above, a location where electric field concentration occurs can be fixed, and a stable switching operation becomes possible. Further, by taking advantage of the electric field concentration, programming at a lower voltage compared to a variable resistance element not having a corner becomes possible.

Although it is also possible that only one of the first electrode and the second electrode has a corner, in this case, the electric field concentration is only effective during programming for either of a set operation, or a reset operation. Only because both the electrodes have a corner according to Embodiment of the present invention, the shortest path between the corners can be determined uniquely, and a formation position of an electroconductive path can become defined. From this, stability in programming operation as has not been achievable with an element, in which only one of the electrodes has a corner, is achieved and consequently the required voltage can be lowered.

Since with respect to a variable resistance element according to the first Embodiment of the present invention the shortest distance between corners of both the first electrode and the second electrode is defined, a formation location of a filament (conductive path) is defined. From this, a programming operation is stabilized and variation of a programming voltage is suppressed at a low level, so that a programming voltage can be made lower.

Since both the electrodes have a corner and the effective electric field during programming can be intensified by an effect of electric field concentration, a programming voltage can be made lower.

Figure 4:
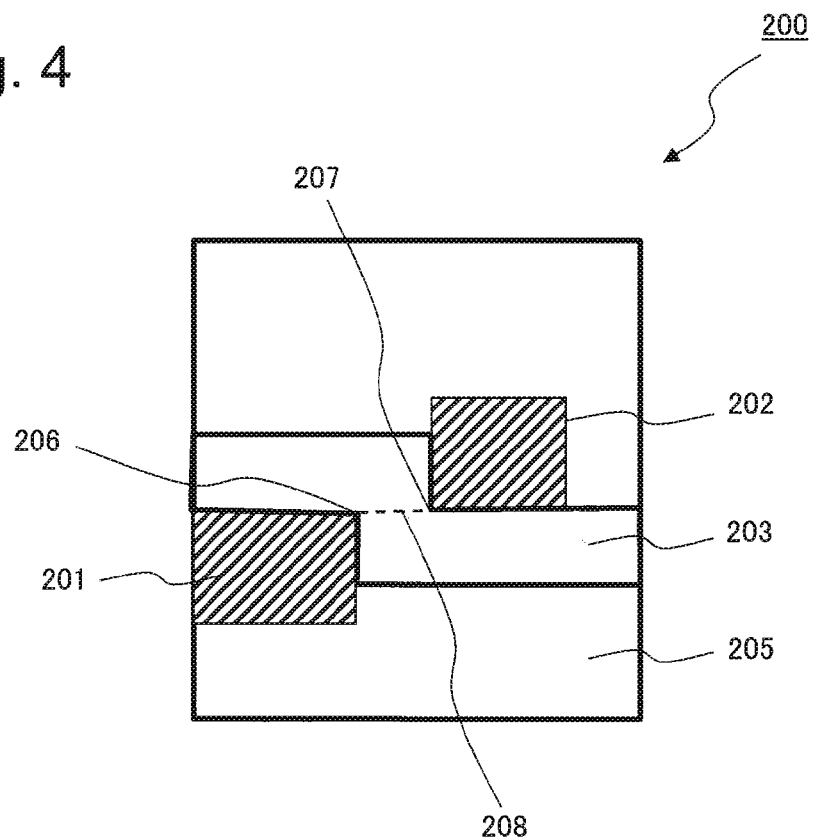
FIG. 4 is a cross-sectional view of a variable resistance element according to the second Embodiment of the present invention.

[Second Embodiment] The constitution of a variable resistance element 200 used in a semiconductor device according to the second Embodiment of the present invention will be described. FIG. 4 is a diagram depicting an exemplar constitution of a variable resistance element to be used in the semiconductor device according to the Embodiment.

[Description of Structure] As depicted in FIG. 4, the constitution of the second Embodiment is identical with Embodiment 1 except that the positions of the upper surface of the first electrode 201 and the lower surface of the second electrode 202 coincide. The variable resistance element 200 is for example a solid electrolyte switch (atomic switch) exhibiting a bipolar resistance change operation. It is configured including a first electrode 201 (active electrode), a second electrode 202 (inactive electrode), and a variable resistance film 203 sandwiched by the electrodes. They are formed inside an insulation film 205 on a semiconductor substrate (not illustrated). The variable resistance film 203 is for example an ion conductor disclosed in Non Patent Literature 1.

The first electrode 201 has a corner of first electrode 206, and the second electrode 202 has a corner of second electrode 207. The distance between the corner of first electrode 206 and the corner of second electrode 207 is represented by a corner-to-corner distance 208. In this case the corner-to-corner distance 208 coincides with the shortest path of an inter-electrode distance between the first electrode 201 and the second electrode 202. Since a programming method of a variable resistance element is identical with Embodiment 1, further description is omitted.

Figure 5:
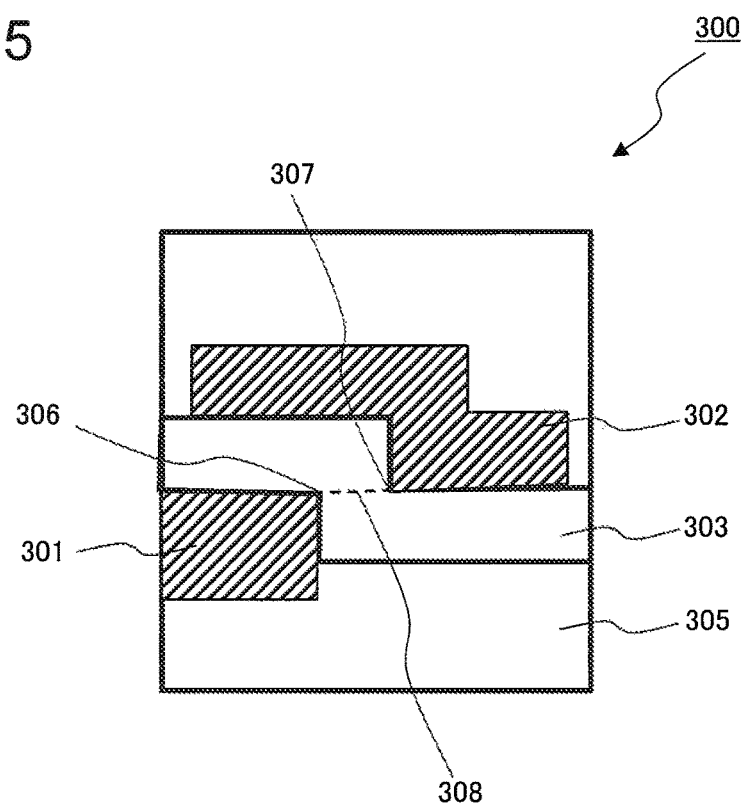
FIG. 5 is a cross-sectional view of a variation of the variable resistance element according to a third Embodiment of the present invention.

FIG. 5 is a variation of the second Embodiment. The variable resistance element 300 according to the present variation includes identically with the variable resistance element 200 according to the second Embodiment a first electrode 301, a second electrode 302, a variable resistance film 303, and an insulation film 305, but only the shape of the second electrode 302 is different. The second electrode 302 is formed along the variable resistance film 303 as in FIG. 5. Further, a corner of first electrode 306 is formed on the first electrode 301, and a corner of second electrode 307 is formed on the second electrode 302. The distance between the corner of first electrode 306 and the corner of second electrode 307 is represented by a corner-to-corner distance 308. Since the Embodiment is identical with the second Embodiment except the shape of the second electrode 302, additional detailed description of the constitution is omitted.

[Description of Action and Advantage] Since in the first Embodiment the length of the shortest path between the electrodes is determined by the positions (distance) of the first electrode 101 and the second electrode 102, in other words by overlay accuracy of lithography, the same may be occasionally larger than the film thickness of the variable resistance film 103. Consequently, there is a drawback that an effect on reduction of a voltage compared to a case not using a corner is unstable. In contrast thereto, by using the structure of the second Embodiment, the shortest distance between the electrodes can coincide with the corner-to-corner distance, and also with the film thickness of the variable resistance film 203, and therefore further reduction to a lower voltage can become possible.

Further, since the distance between the first electrode 201 and the second electrode 202 is defined by the film thickness of the variable resistance film 203 according to the method described in the second Embodiment, the allowance can be reserved larger than in the case of alignment by a lithography process. Therefore, as the result, variation of a threshold voltage can be kept at a low level.

Further, also in a case in which a second electrode 302 is formed on a variable resistance film 303 as in the variation of FIG. 5, the shortest distance between the electrodes can be made coincide with the corner-to-corner distance 308, and also with the film thickness of the variable resistance film 303.

Since with respect to a variable resistance element according to the second Embodiment of the present invention the shortest distance between corners of both the first electrode and the second electrode is defined as in the case of the first Embodiment, a formation location of a filament (conductive path) is defined. From this, a programming operation is stabilized and variation of a programming voltage is suppressed at a low level, so that a programming voltage can be made lower.

Since both the electrodes have a corner and the effective electric field during programming can be intensified by an effect of electric field concentration, a programming voltage can be made lower.

Further, in the case of a variation of the second Embodiment, the shortest corner-to-corner distance is made to coincide with the film thickness of a variable resistance film, the variation of a threshold voltage can be kept smaller than in the first Embodiment.

Figure 6:
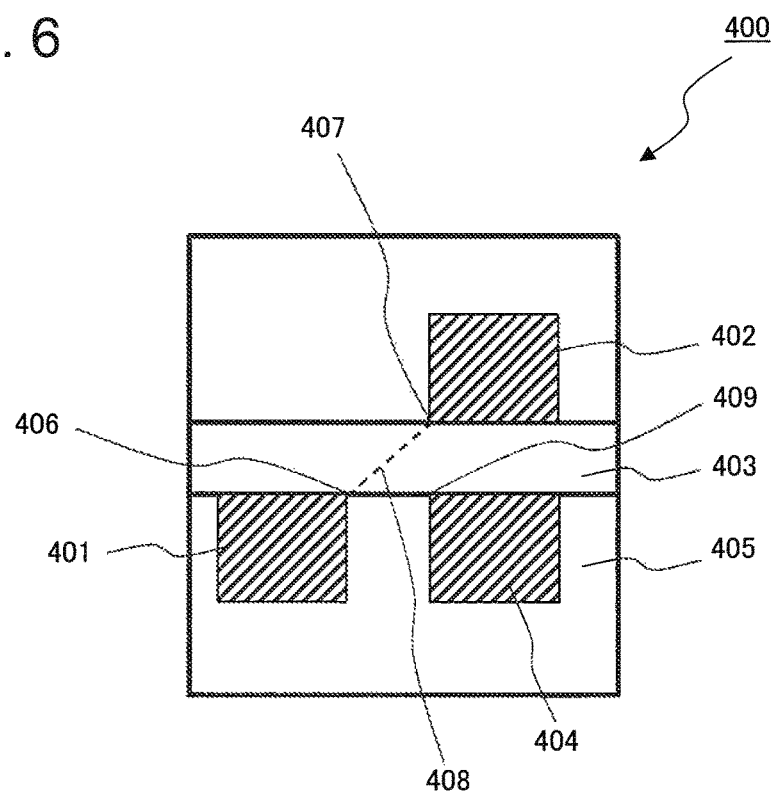
FIG. 6 is a cross-sectional view of a hermetically closed case according to a fourth Embodiment of the present invention.

[Third Embodiment] Next, the constitution of a variable resistance element 400 used in a semiconductor device according to the third Embodiment of the present invention will be described. FIG. 6 is a diagram depicting an exemplar constitution of a variable resistance element to be used in a semiconductor device according to the third Embodiment of the present invention.

[Description of Structure] The variable resistance element 400 is for example a solid electrolyte switch (atomic switch) exhibiting a bipolar resistance change operation. The variable resistance element 400 is configured including a first electrode 401 (active electrode), a second electrode 402 (inactive electrode), a variable resistance film 403 sandwiched by the electrodes, and the third electrode 404. They are formed inside an insulation film 405 on a semiconductor substrate (not illustrated). The variable resistance film 403 is for example an ion conductor disclosed in Non Patent Literature 1.

The first electrode 401 has a corner of first electrode 406, and the second electrode 402 has a corner of second electrode 407. The distance between the corner of first electrode 406 and the corner of second electrode 407 is represented by a corner-to-corner distance 408. In this case the corner-to-corner distance 408 coincides with the shortest path of an inter-electrode distance between the first electrode 401 and the second electrode 402.

The third electrode 404 is provided on the same side as the first electrode 401 with respect to the variable resistance film 403, such that the third electrode 404 is placed to have a common horizontal surface with the first electrode. Further, the third electrode 404 has a corner of third electrode 409.

[Description of Operation] Next, the operation of the variable resistance element 400 of the third Embodiment will be described.

For example, in a case in which the first electrode 401 and the third electrode 404 are Cu, the second electrode 402 is Ru, and the variable resistance film 403 is a polymer solid electrolyte, a transition operation (set operation) from a high resistance state (OFF state) to a low resistance state (ON state) will be described. In this regard, it is enough if the first electrode 401 and the third electrode 404 contain Cu as a main component, and it may be an alloy containing Cu.

In this case, with respect to a voltage to be applied, the electric potential of the first electrode 401 is expressed as V1, that of the second electrode 402 as V2, and that of the third electrode 404 as V3.

When the sate between the first electrode and the second electrode is put into an ON state, voltages are set, for example, at V1=2 V, V2=1 V, and V3=1 V. In this case it is necessary to set the electric potential difference between the first electrode and the second electrode lower than a threshold voltage.

Next, a pulse is applied to the third electrode 404 to set V3=0 V. At this time, since the corner of third electrode 409 is grounded, the electric field density is increased at the corner of first electrode 406. From this an electric field (the number of electrical lines of force per unit area) induced by the applied voltage between the first electrode and the second electrode becomes maximum at the corner of first electrode 406, so that a metal-bridge is formed between the first electrode and the second electrode enabling transition to an ON state.

By an alternative programming method for setting an ON state between the first electrode and the second electrode, for example, V1, V2, and V3 are set at V1=1 V, V2=0 V, and V3=0 V. In this case it is necessary to set the electric potential difference between the first electrode and the second electrode lower than a threshold voltage.

Next, a pulse is applied to the third electrode 404 to set V3=3 V. At this time, since a voltage higher than V2 is applied to the corner of third electrode 409, the electric field density is increased at the corner of first electrode 406. From this an electric field (the number of electrical lines of force per unit area) induced by the applied voltage between the first electrode and the second electrode becomes maximum at the corner of first electrode 406, so that a metal-bridge is formed between the first electrode and the second electrode enabling transition to an ON state.

[Description of Advantages] Since with respect to a variable resistance element according to the third Embodiment of the present invention the shortest distance between corners of both the first electrode and the second electrode is defined as in the case of the first Embodiment, a formation location of a filament (conductive path) is defined. From this, a programming operation is stabilized and variation of a programming voltage is suppressed at a low level, so that a programming voltage can be made lower.

Since both the electrodes have a corner and the effective electric field during programming can be intensified by an effect of electric field concentration, a programming voltage can be made lower.

The voltage values presented in the Embodiment are values for explaining the operation of a semiconductor device according to the Embodiment, and are not meant to impose a limitation on the operation of a semiconductor device using a variable resistance element according to the present invention.

Figure 7:
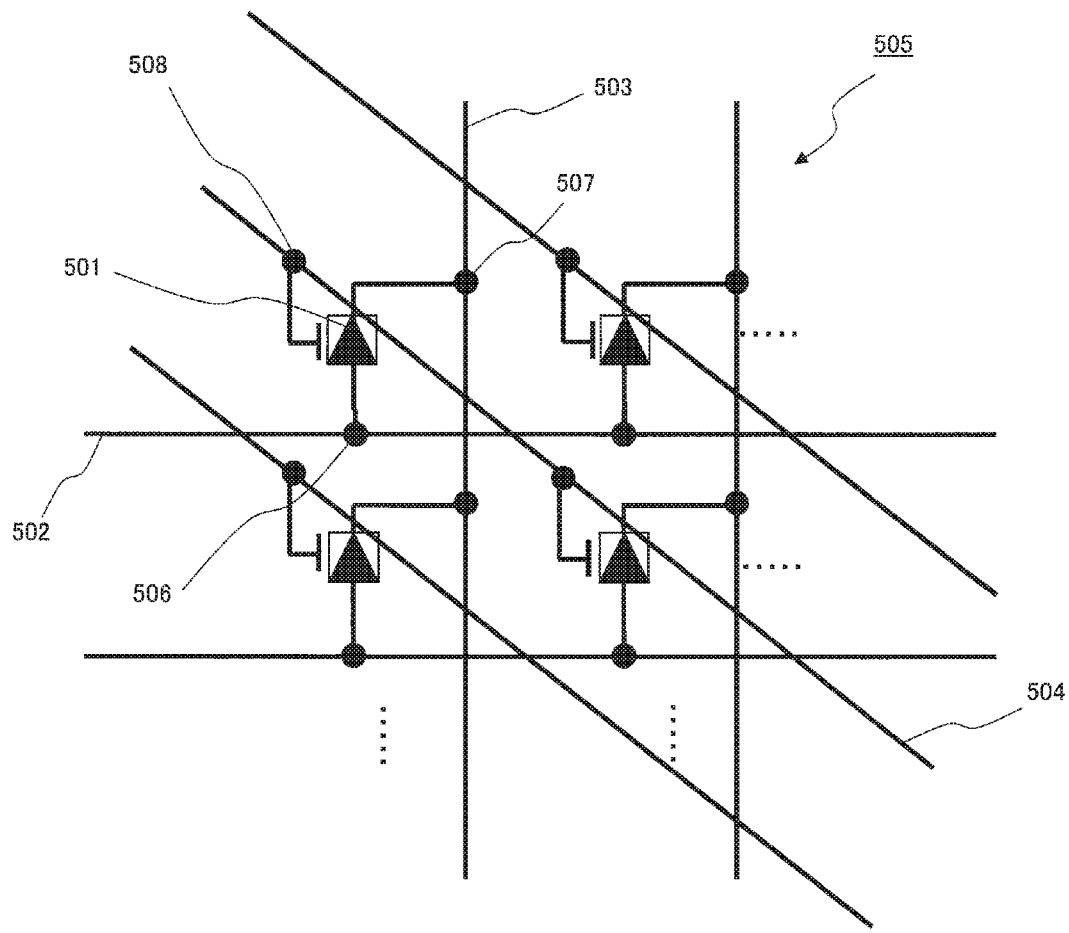
FIG. 7 is a perspective view of a hermetically closed case according to a fifth Embodiment of the present invention.

[Fourth Embodiment] Next, the fourth Embodiment of the present invention will be described. FIG. 7 is a diagram for illustrating a semiconductor device 505 of the fourth Embodiment. As a variable resistance element below, one having the constitution of FIG. 6 is used.

[Description of Structure] The semiconductor device 505 according to the fourth Embodiment of the present invention depicted in FIG. 7 is provided with a first variable resistance element 501 having the same constitution as the variable resistance element 400 according to the third Embodiment. The first variable resistance element 501 has a first electrode 401, a second electrode 402, a third electrode 404, and a variable resistance film 403. As a reference sign for each electrode, the reference sign in FIG. 6 is used.

Further, in the semiconductor device 505, a first control wire 502 connecting with the first electrode 401, a second control wire 503 connecting with the second electrode 402, and a third control wire 504 connecting with the third electrode 404 are added. In this case, the third control wire 504 can be placed nonparallel to both the first control wire 502, and the second control wire 503.

Meanwhile, the first electrode 401 is connected with a first control electrode 506, the second electrode 402 with a second control electrode 507, and the third electrode 404 with a third control electrode 508.

[Description of Operation] The operation of such a semiconductor device 505 will be described. As a programming method, procedures for a case in which the first control wire 502 and the second control wire 503 are firstly electrically connected to put the first variable resistance element 501 into an ON state for transmitting a signal will be described. Therefore, it is premised that the first variable resistance element 501 has been in an OFF state.

A positive voltage not higher than a set voltage Vs is applied (for example, 2 V) to the first control electrode 506, and a voltage lower than the first control electrode 506 is applied (for example, 1 V) to the second control electrode 507, and the same voltage as the second control electrode 507 (for example, 1 V) to the third control electrode 508. The state is defined as a preset state (initial state) of the first variable resistance element 501.

Next, the third control electrode 508 is applied with a voltage to an electric potential below the preset state, or a voltage with the polarity reverse to a voltage applied to the first control wire 502 (for example, 0 V). From this, the first variable resistance element 501 is put into an ON state. Thereafter, the voltages applied to the preset first control electrode 506 and second control electrode 507 are released.

If the first control wire 502 and the second control wire 503 should be isolated, a positive voltage not higher than a reset voltage Vr is applied to the second control electrode 507 (for example, 1.5 V), and a voltage lower than the second control electrode 507 is applied to the first control electrode 506 (for example, 1 V), and the same voltage as the second control electrode 507 to the third control electrode 508 (for example, 1.5 V). From this, the first variable resistance element 501 is put into a preset state.

Next, the third control electrode 508 is applied with a voltage to an electric potential below the preset state, or a voltage with the polarity reverse to a voltage applied to the second control wire 503 (for example, 0 V). From this, the first variable resistance element 501 is put into an OFF state. Thereafter, the voltages applied to the preset first control electrode 506 and second control electrode 507 are released.

Alternatively, as a method without application of a voltage to the third control electrode 508, a positive voltage not lower than a reset voltage V is applied to the second control electrode 507 (for example, 2.5 V), and a voltage lower than the second control electrode 507 is applied to the first control electrode 506 (for example, 0 V). From this, the first variable resistance element 501 is put into an OFF state.

[Description of Action and Advantage] By use of a semiconductor device 505 of the fourth Embodiment as above, and a memory cell containing a selective element such as a transistor and a variable resistance element as a basic unit, a plurality of the memory cells can be aligned in a longitudinal direction and a cross direction respectively. By the alignment, an optional memory cell can be selected among a plurality of the memory cells by means of a word line and a bit line. Thus, a nonvolatile memory can be realized, in which the stored information of either of "1" or "0" can be read from the state of ON or OFF of the variable resistance element by sensing the conduction state of the variable resistance element of the selected memory cell.

When a variable resistance element of the fourth Embodiment is intended to be applied to a crossbar switch used for transmission by signal wires in an ULSI (Ultra Large Scale Integration), occurrence of a drawback that a variable resistance element in a high resistance state is liable to miswriting by the logic swing of a signal (OFF disturb) can be suppressed. Especially, even in a case in which the programming voltage of a variable resistance element is lowered closer to an operation voltage of a logic LSI, the disturb drawback can be avoided. Therefore, lower programming voltage and higher reliability can coexist.

The voltage values presented in the Embodiment are values for explaining the operation of a semiconductor device according to the Embodiment, and are not meant to impose a limitation on the operation of a semiconductor device using a variable resistance element according to the present invention.

Since according to the Embodiment of the present invention, the shortest distance between corners of both the first electrode and the second electrode is defined, a formation location of a filament (conductive path) is defined. From this, a programming operation is stabilized and variation of a programming voltage is suppressed at a low level, so that a programming voltage can be made lower. Further, since both the electrodes have a corner and the effective electric field during programming can be intensified by an effect of electric field concentration, a programming voltage can be made lower.

EXAMPLE 1

Figure 8:
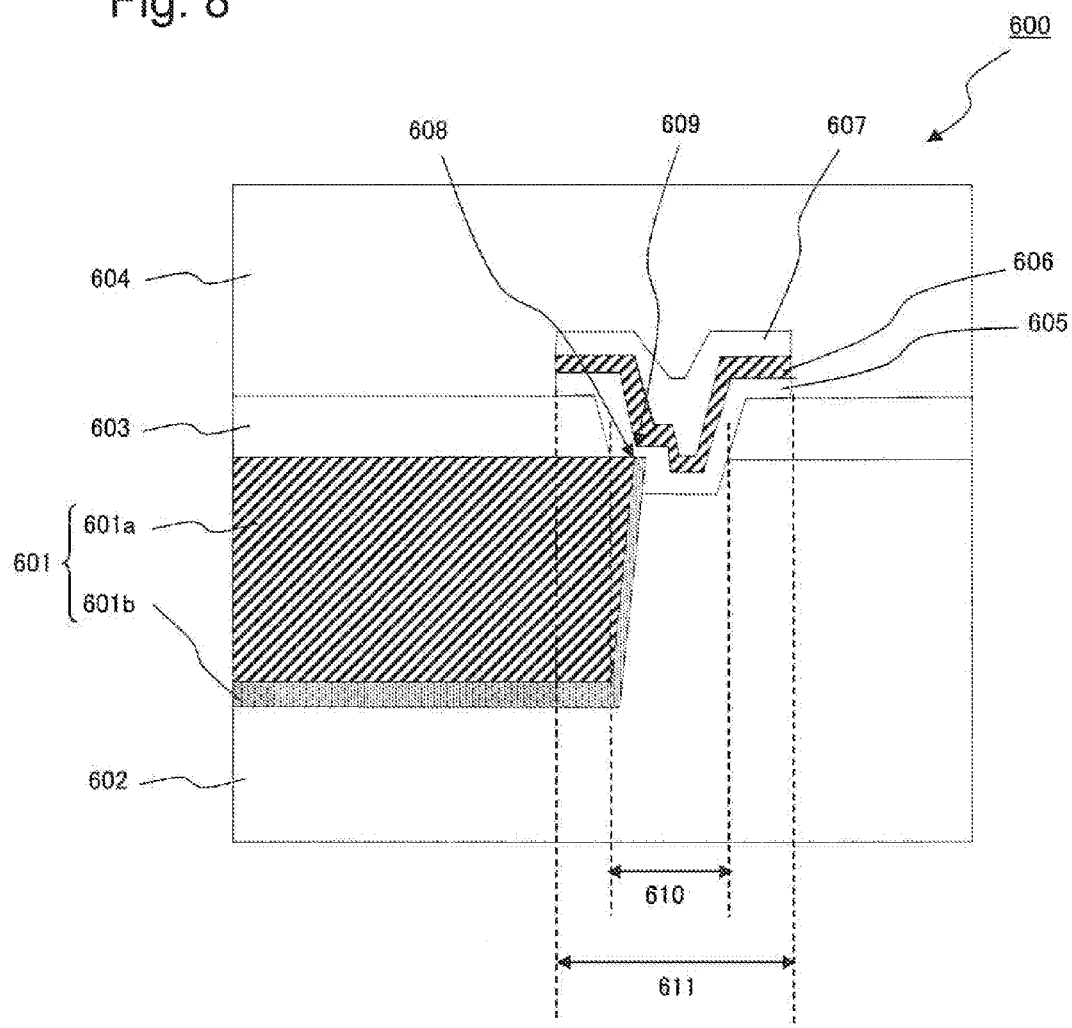
FIG. 8 is a cross-sectional view of a variable resistance element according to Example 1 of the present invention.

Example 1 with respect to a variable resistance element 600 according to the first Embodiment of the present invention will be described. The operation of Example 1 is similar to the operation of the first Embodiment. FIG. 8 is a cross-sectional view of an exemplar constitution of a variable resistance element 600 according to Example 1, and FIG. 9 is a top view thereof.

Figure 9:
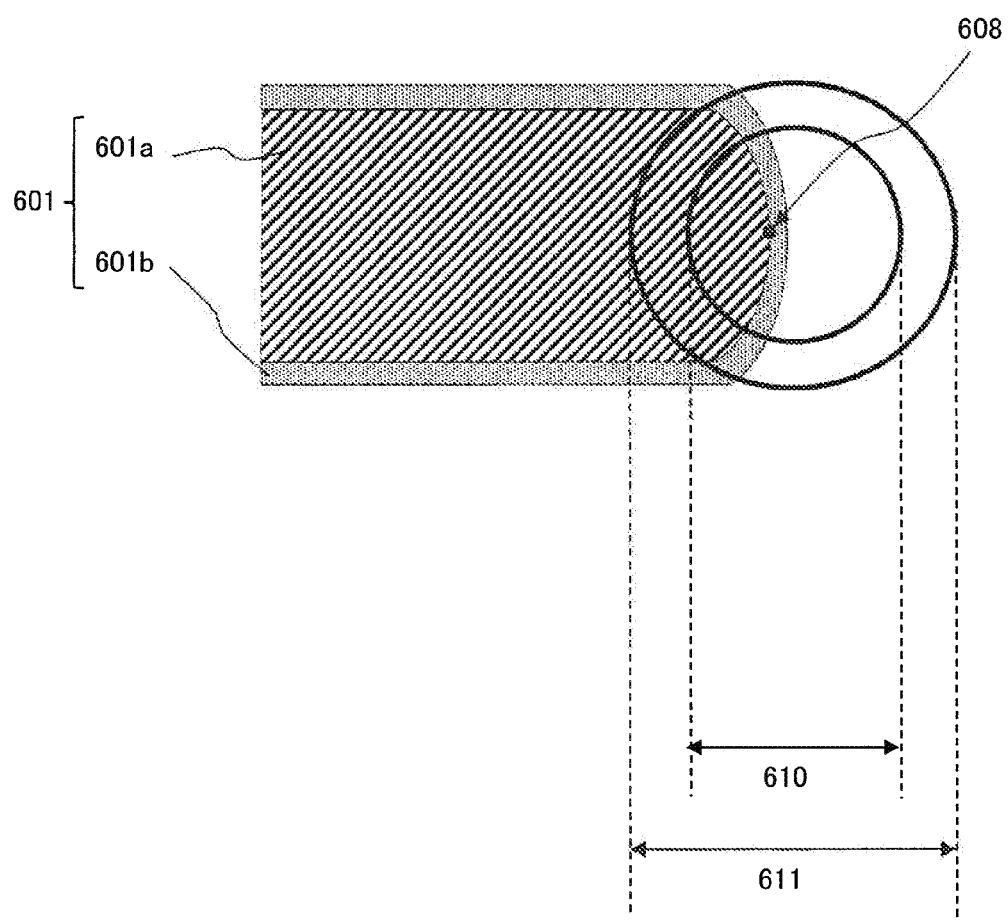
FIG. 9 is a top view of a variable resistance element according to Example 1 of the present invention.

[Description of Structure] The variable resistance element 600 of the present Example depicted in FIG. 8 and FIG. 9 has a wire-cum-first electrode 601 constituted with a copper wire 601a, and a barrier metal 601b.

The wire-cum-first electrode 601 is formed inside a first interlayer insulation film 602. On the upper surface of the wire-cum-first electrode 601 an insulation barrier film 603 is formed and a second interlayer insulation film 604 is formed thereon.

The first and the second interlayer insulation films 602, 604 are insulation films formed on a semiconductor substrate. For example, for the first and the second interlayer insulation films 602, 604, for example, a silicon dioxide thin film, or a low-dielectric constant film (for example, SiOCH film), which is a film with a relative dielectric constant lower than a silicon dioxide thin film, can be used. Further, the first and the second interlayer insulation films are not limited to a monolayer, and may be a film of a plurality of insulation films layered one on another.

The barrier metal 601b may use Ta, Ti, and a layered structure with a nitrogen compound thereof. As depicted in the figure, the barrier metal 601b is placed covering side surfaces of the copper electrode 601a.

The insulation barrier film 603 is constituted of SiN, SiC, SiCN, or a layered structure thereof. In the insulation barrier film 603 a hole 610, which is tapered downward vertically toward a surface of the substrate, is formed.

Further, the variable resistance element 600 of the present Example has a variable resistance film 605 contacting a wire-cum-first electrode 601, as well as a second electrode 606, and an upper electrode 607 thereon.

For the variable resistance film 605, for example, an ion conduction layer based on an oxide such as TaO, TaSiO, HfO, ZrO, and AlO, or an ion conduction layer based on an organic polymer may be used. Also for the variable resistance film 605, a chalcogenide ion conduction layer, such as GeSeTe, and GdTe, doped previously with Cu, which becomes a movable ion, may be used.

The second electrode 606, and the upper electrode 607 are processed to have an electrode shape 611. The second electrode 606 is preferably an electrode inert to a movable ion (copper), and preferably uses an electrode based on a noble metal, such as Ru and Pt.

The upper electrode 607 has a function to protect the second electrode 606 during processing, and may use Ta, Ti, and a nitrogen compound thereof.

The variable resistance element 600 has a corner of wire-cum-first electrode 608 and a corner of second electrode 609. In this case the corner-to-corner distance coincides with the shortest distance between the wire-cum-first electrode 601 and the second electrode 606. In this regard, the corner of wire-cum-first electrode 608 corresponds to a corner of a Cu wire 601*a* (FIG. 9).

[Description of Action and Advantage] In the variable resistance element 600 of Example 1, the distance between the corner of wire-cum-first electrode 608 and the corner of second electrode 609 is determined uniquely as the shortest distance between the wire-cum-first electrode 601 and the second electrode 606. In other words, when a switching operation of the first Embodiment is performed, locations where electric field concentration occurs can be fixed at the corner of wire-cum-first electrode 608 and the corner of second electrode 609, so that a formation position of an electroconductive path can be defined.

In other words, when the variable resistance element according to Example 1 of the present invention is used, a programming operation is stabilized and programming at a lower voltage becomes possible in comparison to a variable resistance element, in which a formation position of an electroconductive path cannot be defined.

EXAMPLE 2

Figure 10:
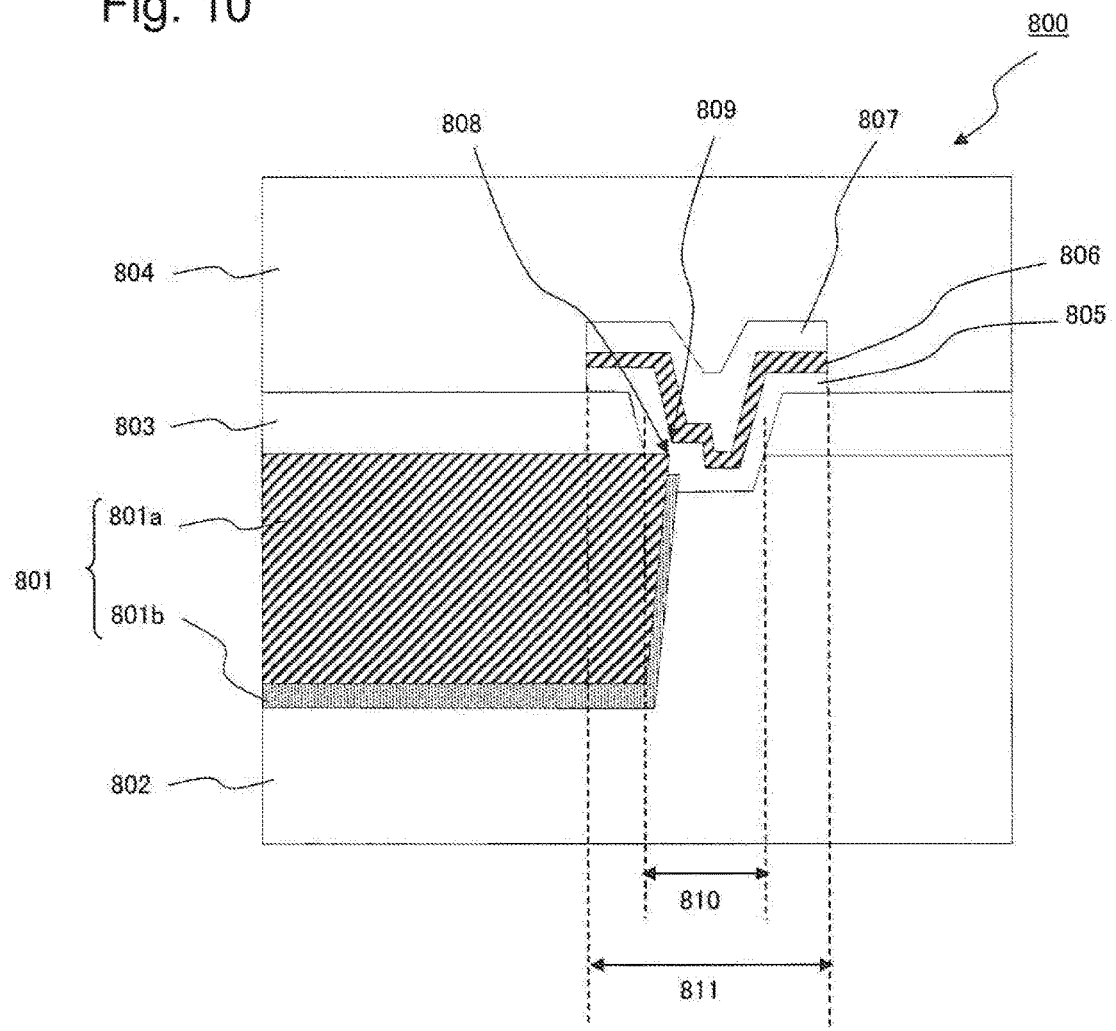
FIG. 10 is a cross-sectional view of a variable resistance element according to Example 2 of the present invention.

Example 2 with respect to a variable resistance element 800 according to the second Embodiment of the present invention will be described. The operation of Example 2 is similar to the operation of the first Embodiment. FIG. 10 is a cross-sectional view of an exemplar constitution of the variable resistance element 800 according to Example 2, and FIG. 11 is a top view thereof.

Figure 11:
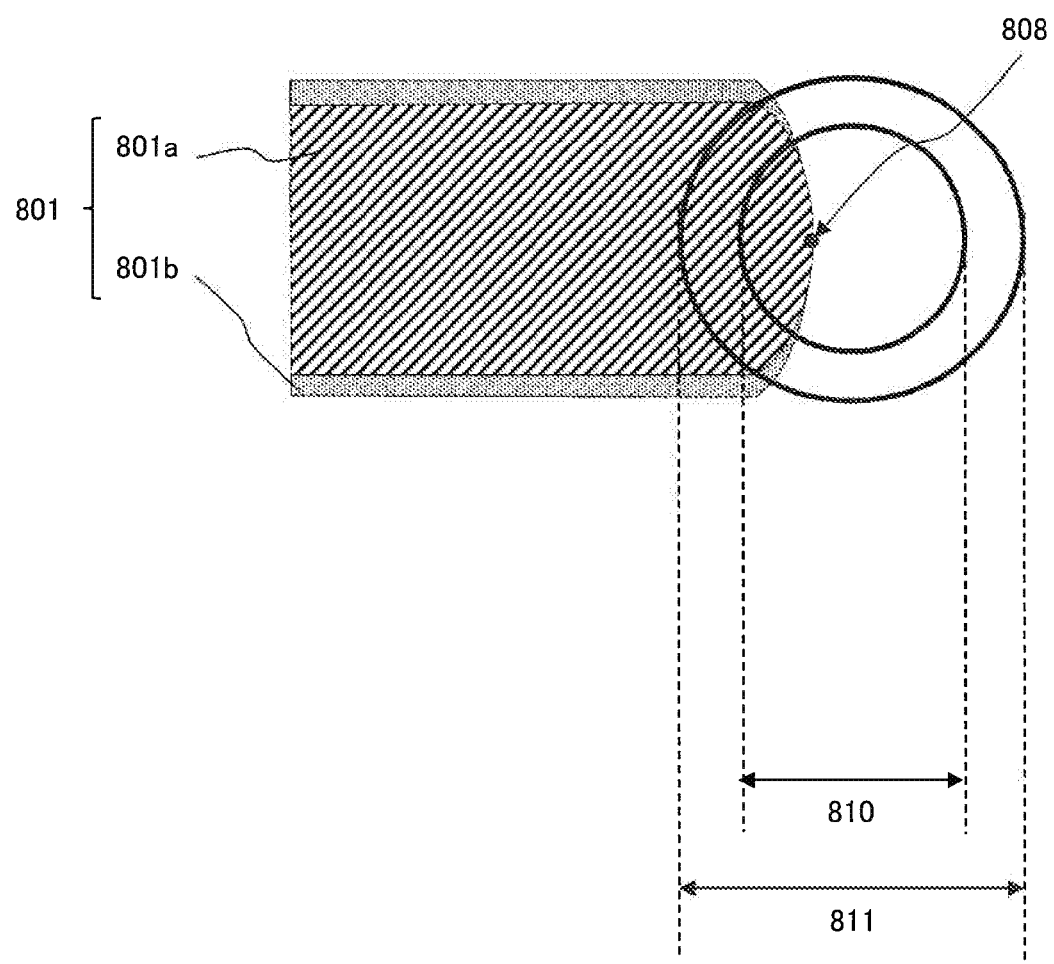
FIG. 11 is a top view of a variable resistance element according to Example 2 of the present invention.

[Description of Structure] The variable resistance element 800 of Example 2 depicted in FIG. 10 and FIG. 11 has a wire-cum-first electrode 801, a second electrode 806, a first interlayer insulation film 802, a second interlayer insulation film 804, an insulation barrier film 803, a variable resistance film 805, and an upper electrode 807. Further, the wire-cum-first electrode 801 has a corner of wire-cum-first electrode 808, and the second electrode 806 has a corner of second electrode 809.

The second electrode 806, and the upper electrode 807 are processed to have an electrode shape 811. In the insulation barrier film 803 a hole 810, which is tapered downward vertically toward a surface of the substrate, is formed. Since the variable resistance element is identical with Example 1, except that the shape of the corner of wire-cum-first electrode 808 is different, description of the same parts will not be duplicated.

The variable resistance element 800 of the present Example has a corner of wire-cum-first electrode 808 and a corner of second electrode 809, and the corner-to-corner distance coincides with the shortest distance between the wire-cum-first electrode 801 and the second electrode 806. In this case, at the corner of wire-cum-first electrode 808, the barrier metal 801*a* is located on a surface lower than the barrier metal 601*a* of the variable resistance element 600 of the Example 1 due to dry etching. Therefore, the corner of wire-cum-first electrode 808 is only constituted of a copper wire 801*b* (FIG. 11).

[Description of Function Effect] In the variable resistance element 800 of Example 2, the distance between the corner of wire-cum-first electrode 808 and the corner of second electrode 809 is determined uniquely as the shortest distance between the wire-cum-first electrode 801 and the second electrode 806. In other words, when a switching operation of the first Embodiment is performed, locations where electric field concentration occurs can be fixed at the corner of wire-cum-first electrode 808 and the corner of second electrode 809, so that a formation position of an electroconductive path can be defined.

In other words, when the variable resistance element according to Example 2 of the present invention is used, a programming operation is stabilized and programming at a lower voltage becomes possible in comparison to a variable resistance element, in which a formation position of an electroconductive path cannot be defined.

When the variable resistance element according to Example 2 of the present invention is used, an electric field is concentrated only at a copper wire part containing a movable ion in comparison to a case using the variable resistance element of Example 1, and therefore programming can be performed at a lower voltage.

EXAMPLE 3

Figure 12:
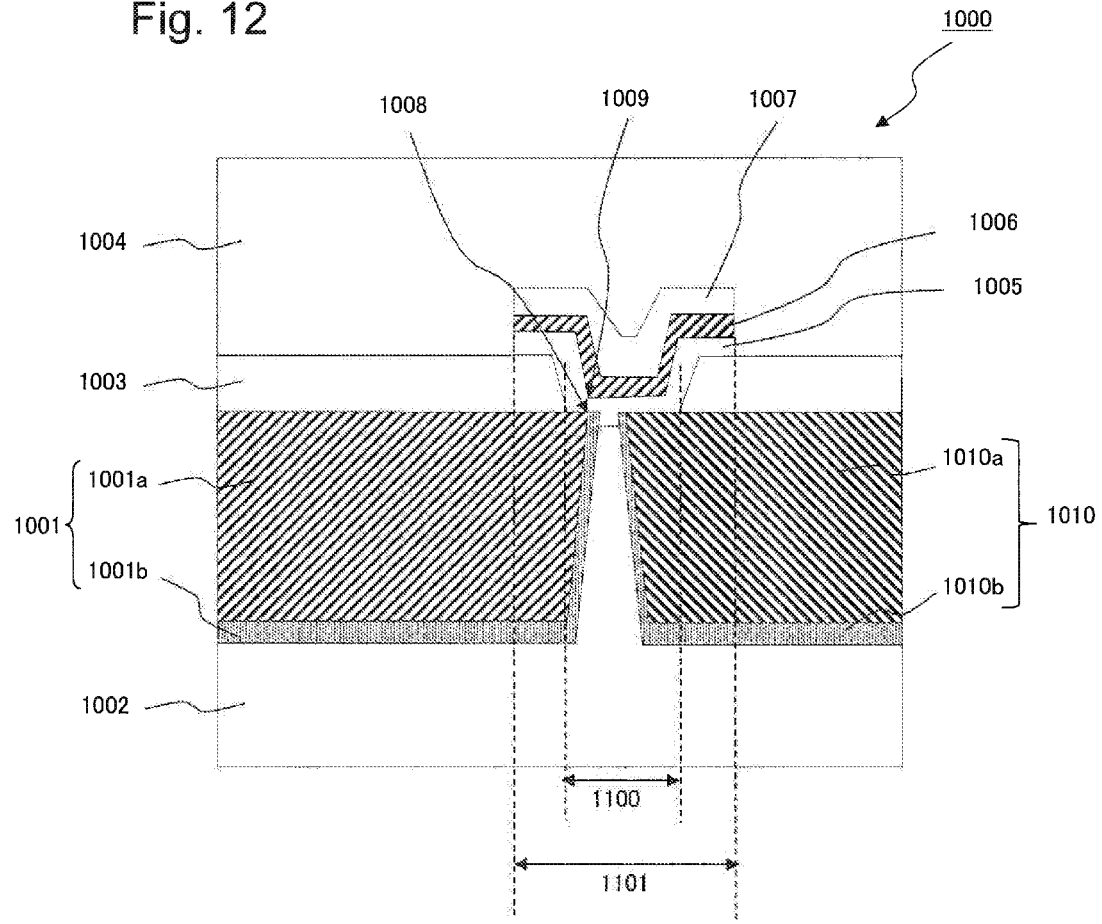
FIG. 12 is a cross-sectional view of a variable resistance element according to Example 3 of the present invention.

Example 3 with respect to a variable resistance element according to the third Embodiment of the present invention will be described. The operation of Example 3 is similar to the operation of the third Embodiment. FIG. 12 is a cross-sectional view of an exemplar constitution of a variable resistance element according to Example 1, and FIG. 13 is a top view thereof.

Figure 13:
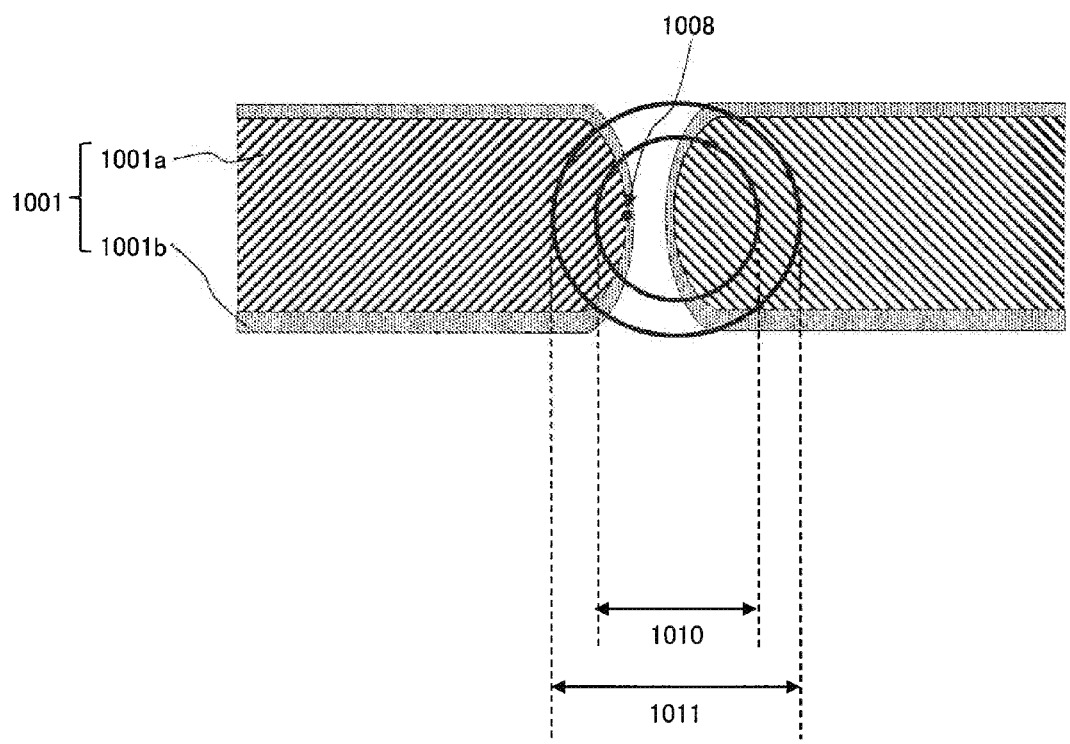
FIG. 13 is a top view of a variable resistance element according to Example 3 of the present invention.

[Description of Structure] The variable resistance element 1000 of Example 3 depicted in FIG. 12 and FIG. 13 has a wire-cum-first electrode 1001, a second electrode 1006, a wire-cum-third electrode 1010, a first interlayer insulation film 1002, a second interlayer insulation film 1004, an insulation barrier film 1003, a variable resistance film 1005, and an upper electrode 1007. The wire-cum-first electrode 1001 is constituted of a copper wire 1001*a* and a barrier metal 1001*b*. Meanwhile, since the variable resistance element is identical with Example 1, except that the same has the wire-cum-third electrode 1010, description of the same parts will not be duplicated.

The variable resistance element 1000 of the present Example has a wire-cum-third electrode 1010 constituted of a copper wire 1010*a* which functions also as a third electrode, and a barrier metal 1010*b*. The wire-cum-third electrode 1010 is in contact with a variable resistance film 1008. Further, the wire-cum-first electrode 1001 and the wire-cum-third electrode 1010 are on the same side with respect to the variable resistance film 1005, and have a common horizontal surface.

The second electrode 1006, and the upper electrode 1007 are processed to have an electrode shape 1101. The second electrode 1006 is preferably an electrode inert to a movable ion (copper), and preferably uses an electrode based on a noble metal, such as Ru and Pt. The upper electrode 1007 has a function to protect the second electrode 1006 during processing, and may use Ta, Ti, and a nitrogen compound thereof. Further, in the insulation barrier film 1003 a hole 1100, which is tapered downward vertically toward a surface of the substrate, is formed.

The variable resistance element 1000 has a corner of wire-cum-first electrode 1008 and a corner of second electrode 1009. In this regard, the corner of wire-cum-first electrode 1008 corresponds to a corner of a Cu wire 1001*a* (FIG. 13).

[Description of Action and Advantage] In this case, the corner-to-corner distance coincides with the shortest distance between the wire-cum-first electrode 1001 and the second electrode 1006, and the electric field strength at a corner is regulated by a voltage applied to the third electrode 1010.

In the variable resistance element 1000 of Example 3, the distance between the corner of wire-cum-first electrode 1008 and the corner of second electrode 1009 is determined uniquely as the shortest distance between the wire-cum-first electrode 1001 and the second electrode 1006. In other words, when a switching operation of the third Embodiment is performed, locations where electric field concentration occurs can be fixed at the corner of wire-cum-first electrode 1008 and the corner of second electrode 1009, so that a formation position of an electroconductive path can be defined.

In other words, when the variable resistance element according to Example 3 of the present invention is used, a programming operation is stabilized and programming at a lower voltage becomes possible in comparison to a variable resistance element, in which a formation position of an electroconductive path cannot be defined.

Further, by using the variable resistance element of Example 3, a programming method allowing application of a programming voltage also to a wire-cum-third electrode can be used. In other words, the OFF disturb between the first electrode and the second electrode can be maintained high, and therefore a variable resistance element achieving higher reliability and voltage reduction can be obtained.

Although a variable resistance element using an ion conduction layer was described specifically in the above Embodiments and Examples, another type of a variable resistance element can be also used.

In the above Embodiments and Examples, a production device technology of a semiconductor having a CMOS (Complementary Metal Oxide Semiconductor) circuit as an application field constituting a back ground of the invention made by the present inventors were described in detail as an application example of the present invention, and a constitution with a variable resistance element formed inside a multi-layer copper wiring on a semiconductor substrate was described. However, the present invention is not limited to the technology, and for example, can be applied to a semiconductor product having a memory circuit, such as a DRAM (Dynamic Random Access Memory), a SRAM (Static Random Access Memory), a flash memory, a FeRAM (Ferroelectric Random Access Memory), a MRAM (Magnetic Random Access Memory), a resistive random access memory, and a bipolar transistor, and a semiconductor product having a logic circuit such as a microprocessor, or onto a copper wire of a board or package mounting them concurrently. Further, the present invention may be applied for joining an electron circuit device, a light circuit device, a quantum circuit device, a micromachine, a MEMS (Micro Electro Mechanical Systems), etc. with a semiconductor device. Further, although Examples of a switching function were mainly described in the above Embodiments and Examples, the invention may be used also for a memory element utilizing both nonvolatile characteristics and variable resistance characteristics.

Further, it is possible to confirm the structure of a variable resistance element according to the present invention in a device after production. Specifically, it is possible to confirm that a copper wire is used in a multi-layer wiring by observing a cross-section of an observation target device by a TEM (Transmission Electron Microscope). Using a TEM, when a variable resistance element is mounted, confirmation of a structure described in the present invention can be made by identifying electrodes in a variable resistance element and observing presence of a corner in the electrode and agreement of the corner-to-corner distance with the shortest distance between the electrodes. Further, it is possible to confirm a material to be contained according to the present invention by carrying out in addition to TEM a chemical composition analysis, such as EDX (Energy Dispersive X-ray Spectroscopy), and EELS (Electron Energy-Loss Spectroscopy).

The present invention is described above referring to various Embodiments and Examples, provided that the present invention is not limited to the Embodiments and Examples. With respect to the constitution or details of the present invention, persons skilled in the art may conceive modifications or variations without departing from the spirit or scope of the present invention. For example from the teachings in the description in the Embodiments and Examples persons skilled in the art can easily make many variations and substitutions based on constitutional elements and techniques equivalent to the content in the Embodiments and Examples, and all such variations and substitutions are considered within the scope and spirit of the present invention.

This application is based upon and claims the benefit of priority from Japanese patent application No. 2012-60864, filed on Mar. 16, 2012, the disclosure of which is incorporated herein in its entirety by reference.

REFERENCE SIGNS LIST

101 first electrode
102 second electrode
103 Variable resistance film
105 Insulation film
106 Corner of first electrode
107 Corner of second electrode
108 Corner-to-corner distance
404 third electrode
409 Corner of third electrode
501 first variable resistance element
502 first control wire
503 second control wire
504 third control wire
505 Semiconductor device
506 first control electrode
507 second control electrode
508 third control electrode
601 Wire-cum-first electrode
601*a* Copper wire
601*b* Barrier metal
602 first interlayer insulation film
603 Insulation barrier film
605 Variable resistance film
606 second electrode
607 Upper electrode
608 Corner of wire-cum-first electrode
609 Corner of second electrode
1001 Wire-cum-first electrode
1001*a* Copper wire 1001b Barrier metal
1002 first interlayer insulation film
1003 Insulation barrier film
1005 Variable resistance film
1006 second electrode
1007 Upper electrode
1008 Corner of wire-cum-first electrode
1009 Corner of second electrode
1010 Wire-cum-third electrode

What is claimed is:

1. A variable resistance element comprising:
a variable resistance film;
a first electrode placed on one of surfaces of the variable resistance film, the first electrode configured to be a wiring; and
a second electrode placed on the other surface of the variable resistance film, the second electrode configured to be an inactive electrode,
wherein
the first electrode has a curved edge;
an insulation barrier film has an opening formed therein, in which a part of the variable resistance film is inserted, the insulation barrier film provided between the first electrode and the variable resistance film; and
the curved edge of the first electrode is in contact with the variable resistance film through the opening.

2. The variable resistance element according to claim 1 comprising a third electrode placed on the one of surfaces of the variable resistance film, wherein
the third electrode is arranged so as to overlap the variable resistance film through the opening more so than the first electrode, wherein the first electrode is configured to be an active electrode.

3. The variable resistance element according to claim 1, wherein,
the variable resistance element is a bipolar type,
the first electrode comprises a material as a supply source of a metal ion,
the second electrode is composed of a material which is harder to ionize than the first electrode, and
the variable resistance film is an ion conductive layer in which the metal ion is conductive.

4. The variable resistance element according to claim 3, wherein,
the first electrode serves as a copper wiring, and
a surface of the first electrode that does not contact the variable resistance film is covered with a barrier metal.

5. The variable resistance element according to claim 3, wherein at least the curved edge of the first electrode is composed of a material comprising copper.

6. The variable resistance element according to claim 3, further comprising a third electrode placed on the one of surfaces of the variable resistance film, wherein,
the third electrode serves as a copper wiring, and
a surface of the third electrode that does not contact the variable resistance film is covered with a barrier metal.

7. The variable resistance element according to claim 4, wherein:
the first electrode is configured to be any one of wiring layers of multi-layer wiring, and
the curved edge of the first electrode is configured to be a point such that the distance between the first electrode and a curved edge of the second electrode is the uniquely determined shortest distance between the curved edge of the first electrode and the curved edge of the second electrode.

8. A semiconductor device comprising the variable resistance element according to claim 1.

9. A programming method using a variable resistance element, the variable resistance element including a variable resistance film; a first electrode placed on one of surfaces of the variable resistance film, the first electrode configured to be a wiring; a second electrode placed on the other surface of the variable resistance film, the second electrode configured to be an inactive electrode; and a third electrode placed on the one of surfaces of the variable resistance film and configured to be an inert electrode, wherein the first electrode has a curved edge; an insulation barrier film having an opening formed therein, in which a part of the variable resistance film is inserted, the insulation barrier film provided between the first electrode and the variable resistance film; and the curved edge of the first electrode is in contact with the variable resistance film through the opening; the method comprising:
applying a voltage between the first and second electrodes in an initial state; and
changing the electrical resistance of the variable resistance film by applying a voltage pulse to the third electrode.

* * * * *